United States Patent [19]

Nagaoka et al.

[11] Patent Number: 5,447,803
[45] Date of Patent: Sep. 5, 1995

[54] METHOD FOR FORMING TITANIUM NITRIDE FILM AND VESSEL COATED BY SAME

[75] Inventors: Hitoshi Nagaoka, Tokyo; Hiroshi Kanno, Yokohama, both of Japan

[73] Assignee: Niigata Engineering Co., Ltd., Tokyo, Japan

[21] Appl. No.: 171,248

[22] Filed: Dec. 20, 1993

Related U.S. Application Data

[63] Continuation of Ser. No. 835,473, filed as PCT/JP90/00974, Jul. 31, 1990, published as WO92/00032, Jan. 9, 1992, abandoned.

[30] Foreign Application Priority Data

Jun. 29, 1990 [JP] Japan .................................. 2-69274
Jul. 4, 1990 [JP] Japan .................................. 2-176968

[51] Int. Cl.$^6$ ...................... C23C 16/34; C23C 16/40; B05D 3/02
[52] U.S. Cl. ...................... 428/698; 432/264; 432/156; 427/255.7; 427/372.2; 427/530; 99/324; 204/192.1; 204/192.16; 428/699; 428/702
[58] Field of Search ............... 427/248.1, 255.1, 255.3, 427/255.7, 372.2; 99/324; 204/192.1, 192.31; 428/698, 699, 702, 639; 432/264, 265, 156

[56] References Cited

U.S. PATENT DOCUMENTS 4,226,082 10/1980 Nishida .
4,450,205 5/1984 Haba .................. 427/255.2

FOREIGN PATENT DOCUMENTS 3142312 5/1983 Germany .
49-018604 5/1974 Japan .
52-149234 12/1977 Japan .
60-014831 1/1985 Japan .
60-208472 10/1985 Japan .
63-018049 1/1988 Japan .

OTHER PUBLICATIONS

Heimler, Charles et al., Focus on Physical Science, Merrill Publishing, 1981, p. 173.
Database WPIL, Section Ch, Week 8716, Derwent Publications Ltd., London, GB; Class M13, AN 87-112198 & JP-A-62 057 576 (Kakuno Hamono), 1987.
A. J. Perry, Journal of Vacuum Science and Technology: Part A "The color of TiN and HfN: Aging effects", vol. A4, No. 6, (1986), pp. 2670–2673.
A. Korhonen et al., Haerterei Technische Mitteilungen "Einfluss einer nachfolgenden Wärmebehandlung auf die Haftung und die Eigenschaften von ionenplattierten TiN–Beschichtungen", vol. 41, No. 3, (1986), pp. 133–136.
Heimer, Charles et al., Focus on Physical Science, Merrill Publishing, 1981, p. 173.

Primary Examiner—Shrive Beck
Assistant Examiner—Bret Chen
Attorney, Agent, or Firm—Scully, Scott, Murphy & Presser

[57] ABSTRACT

A titanium nitride film forming method employing an ion-plating method to produce good decorative properties, to a titanium nitride film forming method which can maintain the stability of the color tone even under high temperatures, and to the vessel obtained through the above methods. The titanium nitride film-forming method used in the present invention is; (1) a titanium nitride film-forming method wherein a titanium nitride film is formed over the surface of a substrate by either the physical metalizing method or the chemical metalizing method, (2) a titanium nitride film-forming method wherein a titanium nitride film is formed over the surface of a substrate, and the substrate is, then, heated in a mixed atmosphere of oxygen and nitrogen, thereby forming a transparent and stable titanium oxide film over the surface of the titanium nitride film, and (3) the titanium nitride film forming method wherein a titanium nitride film is formed over the surface of a substrate, and the substrate is, then, heated in an nitrogen atmosphere, thereby effecting a color tone stabilizing treatment which diffuses nitrogen into the titanium nitride film. The respective titanium nitride film-forming methods are used to provide a vessel manufactured by forming the titanium nitride film over the surface of the vessel's substrate.

4 Claims, 7 Drawing Sheets

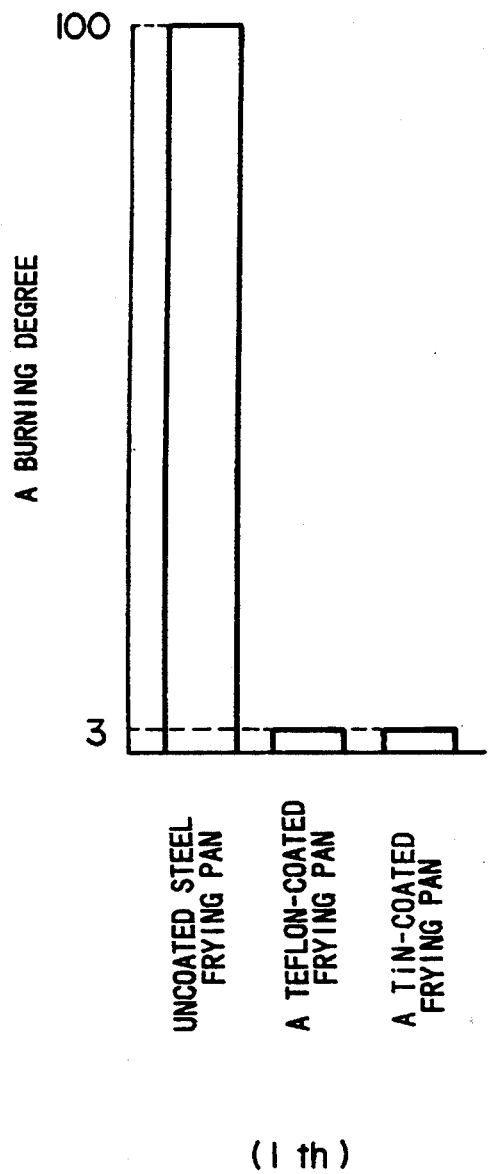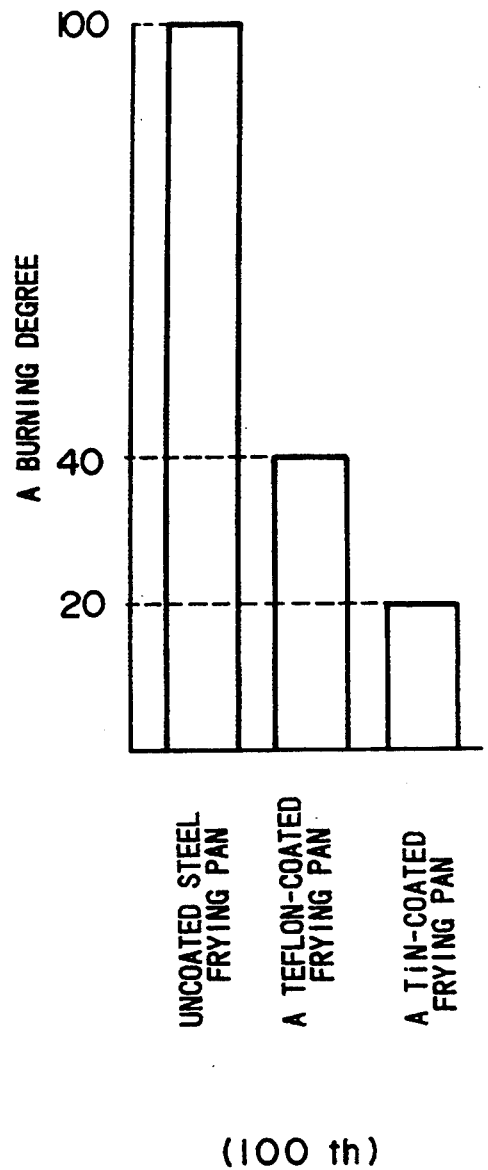

(1 th)

(100 th)

METHOD FOR FORMING TITANIUM NITRIDE FILM AND VESSEL COATED BY SAME

This is a continuation of application Ser. No. 835,473 filed as PCT/JP90/00974, Jul. 31, 1990, published as WO92/00032, Jan. 9, 1992, now abandoned.

TECHNICAL FIELD

The present invention relates to a method for forming a titanium nitride (TIN) film over the surface of a substrate and to a cooking vessel with a TiN coating manufactured using the formation method thereof.

BACKGROUND ART

Traditionally, a cooking pan such as a frying pan or a shallow pot (hereinafter referred to as the "pan") is made simply by forming a piece of metallic material, such as steel, and coating the inner surface of the pan with a fluororesin such as TEFLON..

Pans coated with fluororesin have been extensively used as frying pans and the like because of their prevention of charred food during cooking and their resistance to rust.

However, pans coated with fluororesin are not attractive because fluororesins are colorless, and they do not have sufficient durability because fluororesins are soft. Such fluororesin properties cause the coated layers to deteriorate or peel off after repeated use and result in reduced effectiveness in the prevention of burnt food.

DISCLOSURE OF INVENTION

The present invention is designed in consideration of the reasons above, and an object of the present invention is to provide a method of forming a TiN film and the pan obtained by such a method.

In the first mode of the present invention's TiN film formation method, a Ti film is formed over the surface of a cooking vessel by using a physical vapor deposition method, and then a TiN film is formed over the surface of the Ti film by using a physical vapor deposition method, whereby it is possible to form, on the surface of the substrate, a TiN film with a beautiful golden color, a high hardness value, and chemical stability.

A pan, which is manufactured by forming TiN film over the surface of the substrate of the pan in accordance with the above method and obtained in such a maimer, provides the following effects:
(1) The cosmetic properties of the pan are improved because the TiN film has a beautiful golden color.
(2) The surface of the pan's resistance to wear and tear is improved because of the high hardness of TiN.
(3) Food cooked in the pan will not burn or stick to the surface of the pan because TiN is chemically stable and will not react to the burned food.

In the second mode of the TiN film formation method according to the present invention, a Ti film is formed over the surface of a cooking vessel by using a physical vapor deposition method, and then the TiN film is formed on the surface of the Ti film, the substrate is heated in an oxygen and nitrogen atmosphere, thereby coating the surface of the TiN film with a very thin layer of titanium oxide ($TiO_2$) several several hundred angstoms thick. With this method, the thin $TiO_2$ layer over the TiN film surface is transparent and will not change the color of the golden TiN film. In addition, since the thin $TiO_2$ film restricts the penetration of external oxygen to areas within the film, it is possible to obtain a TiN film with a stable color which will not change even if subjected to high temperatures.

By forming the TiN film over the pan's surface in accordance with the above method, it becomes possible to maintain the beautiful golden color of the TiN film on the surface of the pan's substrate, as well as to achieve those effects that can be obtained by the aforementioned method.

In the third mode of the TiN film formation method according to the present invention, a Ti film is formed over the surface of a cooking vessel by using a physical vapor deposition method, and then the TiN film is formed over the surface of the TiN film and the substrate is heated in a nitrogen atmosphere to diffuse the nitrogen into the TiN film, thereby fixing the residual titanium (Ti) as TiN. By this method, it is possible to obtain a TiN film with a color which is stable even if subjected to high temperatures.

Furthermore, in the present invention, a TiN film is formed on the surface of a pan by the methods mentioned above, which restrict changes in color, and such a pan is thus provided.

BRIEF DESCRIPTION OF DRAWINGS

FIG. 4, FIG. 5, FIG. 6, and FIG. 7 are diagrams to illustrate examples of the experiments related to the present design.

BEST MODE FOR CARRYING OF THE INVENTION

First Embodiment

Figure 3:
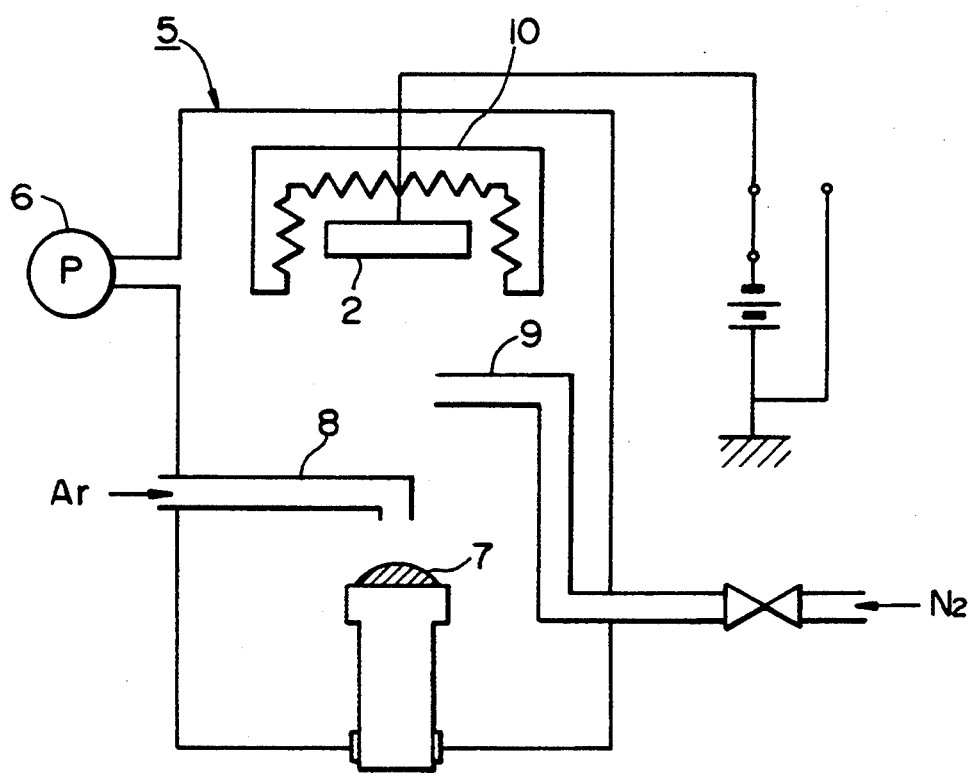
FIG. 3 is a conceptual diagram showing an ion plating apparatus.

FIG. 3 shows an example of an ion plating apparatus used in the manufacture of a frying pan (1) according to the method of the first embodiment of the present invention. The inside of this ion plating apparatus (5) is maintained at a vacuum of about $10^{-5}$ to $10^{-7}$ Tort by a vacuum pump (6). Several hundred volts are applied to the body (2) of the frying pan arranged inside of the ion plating apparatus (5). Titanium (7) (a coating material) is placed on the side opposite to the body (2) of this frying pan. In the vicinity of this titanium (7) is an ion electrode (8) which uses Ar gas for Argon cleaning the surface before the film formation of the frying pan body (2), and adds nitrogen to the atmosphere for heating and evaporation during film formation followed further by ionization. In order to form a TiN layer (4) on the frying pan body (2) by means of the ion plating apparatus (5), the inner surface (the surface to be coated) of the frying pan body (2) is first ground to a mirror finish and has removed from it any unevenness such as cutting marks from the lathe or oil sumps. Debris or oil is removed from the pan by means of the washing and degreasing of the ground surface. Once the frying pan body (2) has completed such pretreatment, it is placed inside the ion plating apparatus (5).

Then, the titanium (7) is subjected to ion bombardment in an Ar atmosphere and heated by an electron beam issued from the ion electrode (8). The titanium (7) is evaporated, and the evaporated particles are ionized. The ionized particles have high kinetic energy and collide strongly with and attach to the frying pan body (2), so that a Ti layer (3) is formed over the surface of the frying pan body (2).

When the thickness of the Ti layer (3) is several hundred angstroms, the voltage applied to the frying pan body (2) is lowered, and nitrogen is introduced into the ion plating apparatus (5) through a nitrogen supply passage (9) in order to maintain the pressure inside the apparatus (5) at about $10^{-5}$ Torr. The aforementioned ionized titanium particles and the nitrogen are caused to react by the above operation so as to attach TiN to the Ti layer (3) on the surface of the frying pan body (2), and a uniform TiN layer (4) 2 to 3 micron thick is formed thereon. A frying pan (1) is thus manufactured by the above operation.

Figure 1:
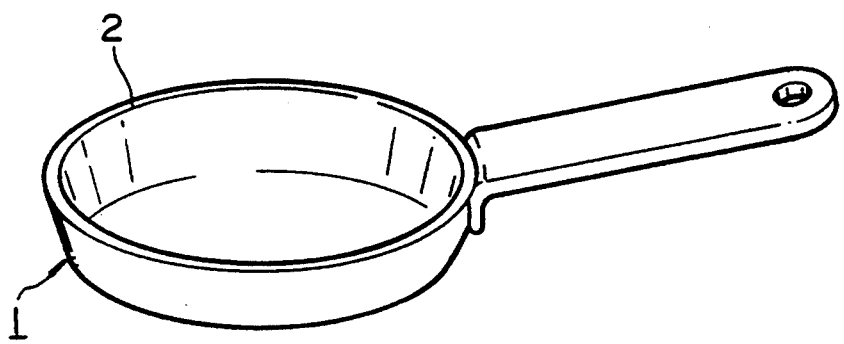
FIG. 1 is an embodiment of the present design showing a perspective diagram of a frying pan.
Figure 2:
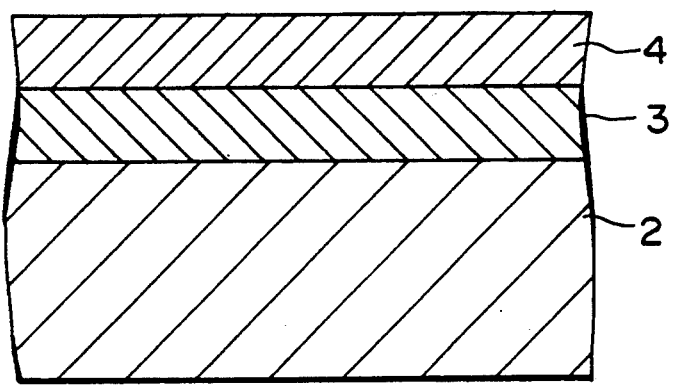
FIG. 2 is cross-sectional view of the main part of the frying pan shown in FIG. 1.

FIG. 1 shows the frying pan manufactured by such a method, wherein the numeral 1 denotes the frying pan. This frying pan is, as shown in FIG. 2, composed by providing a 2 to 3 micron thick TiN layer (4) on the inside of the frying pan body (2), which is made from a metallic material such as steel by means of a Ti layer (3) several hundred angstroms thick.

The above Ti layer (3) is formed directly over the surface of the frying pan body (2) and is very firmly attached thereto. The TiN layer (4) is firmly formed in close contact with the Ti layer (3), so that the TiN layer (4) is securely joined to the frying pan body (2).

The frying pan (1) manufactured by this method is provided on the surface of the body (2) thereof, with the TiN layer (4) producing a beautiful golden color, thereby improving the cosmetic properties of the pan, and conferring a feeling of high quality thereto.

Further, because the TiN layer has high hardness (about Hv2000 in Vickers' hardness), it is possible to improve the durability of the pan's surface. Moreover, because the TiN layer (4) is chemically stable, it does not react to burnt food and is excellent in its resistance to adhesion of burnt food, and thus the frying pan will almost never allow burnt food to stick thereto during cooking. Furthermore, even if burnt food does stick to the frying pan, it can be easily removed therefrom.

In the method stated above, the frying pan is given as an example, but a relatively shallow pan can be produced instead of a frying pan.

In the method stated above, the TiN layer is formed only on the inside surface of the frying pan body, but the TiN layer can also be formed over the entire surface, including the handle, or only a part of the inside surface.

EXPERIMENT 1

The apparatus shown in FIG. 3 was used to form at 2 to 3 micron TiN layer over the surface of a steel frying pan by means of an approximately 200 Å Ti layer, and a frying pan having the same composition as the one shown in FIG. 1 (hereinafter referred to as the TiN-coated frying pan) was thus manufactured. Three types of frying pans, a TiN coated frying pan, a traditional steel frying pan (uncoated) and a TEFLON coated frying pan, were used to conduct the following experiments.

Fish (sole) of almost the same size were prepared, and each sole was placed on the center of the cooking plane of each frying pan (previously unused). The three frying pans each placed with a sole thereon were heated simultaneously with strong flames of the same intensity for about five minutes. The soles were removed, and the weight of the burnt sole remaining on the cooking plane of the frying pan was measured.

Then, three other frying pans identical to those above were used for repeated heating and cooking (100 times), and the weight of the burnt sole remaining on the cooking plane of the frying pan was measured again.

The results of this experiment are shown in FIG. 4 and FIG. 5. The burning levels shown in these diagrams are expressed as an absolute value of the weight of the burned portion of the fish, where the amount of burned fish cooked on an uncoated frying pan is taken to be 100.

As shown in FIG. 4 and FIG. 5, when a traditional steel frying pan (uncoated one) was used, the burn was considerable after both the first and the 100th cooking.

When a TEFLON-coated frying pan was used, little burn was observed after the first cooking (a burning degree is 3.). However, after the 100th cooking, the burning degree was as large as 40, which indicates a deterioration of the TEFLON's ability to prevent burning after the repeated use of the frying pan.

When a TiN-coated frying pan was used,, little burn was observed (the burning degree is 3) after the first cooking, as in the case of the TEFLON-coated frying pan. After the 100th cooking, the burning degree was 20, which is about half that of the TEFLON-coated frying pan. It was thus confirmed that after repeated cooking the TiN-coated frying pan is effective in preventing food from burning.

EXPERIMENT 2

In the second experiment, kiao-tz (dumplings stuffed with minced pork) were used, as they are one of the most easily burned of foods. Fifty dumplings of almost the same size were prepared for one frying pan; three types of unused frying pans similar to those used in the first experiment were prepared; and the fifty dumplings were placed on their cooking planes. The three types of frying pans with the dumplings were placed on household gas-burners and were heated simultaneously for about five minutes with a strong flame of the same intensity. Afterwards, the number of burned dumplings was counted.

Figure 6:
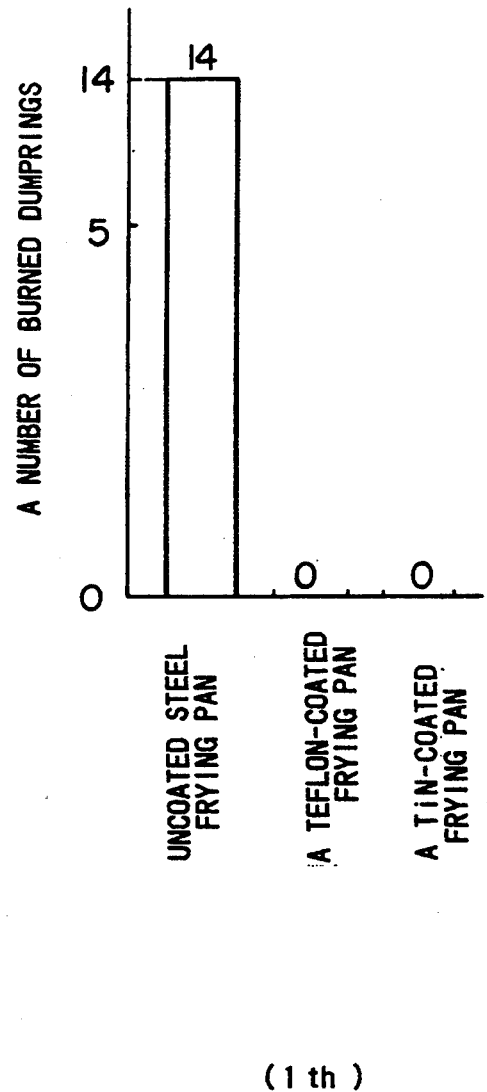
Figure 7:
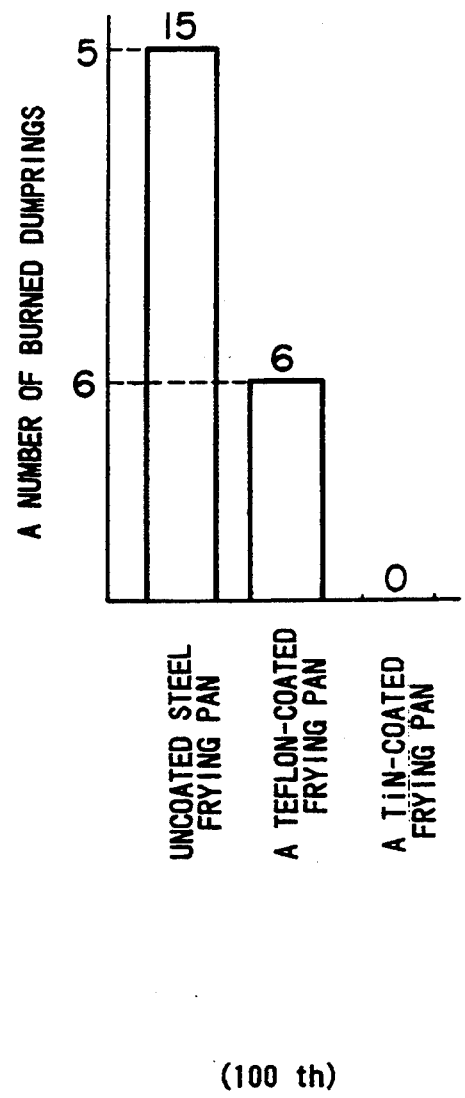

Then, each of the three types of frying pans repeated the above operations 100 times, and the number of burned dumplings was counted again. The results of this experiment are shown in FIG. 6 and FIG. 7. As is apparent from these diagrams, when a traditional, uncoated steel frying pan was used, the number of burned dumplings was notable both after the first cooking and after the 100th cooking.

When a TEFLON-coated frying pan was used, no dumpling was burned after the first cooking. However, after the 100th cooking, six dumplings were found burned, indicating the deterioration of the TEFLON's ability to prevent burning after repeated cooking.

When a TiN-coated frying pan was used, there were no dumplings burned after the first cooking. There were also no burned dumplings found after the 100th cooking, thus confirming that the TiN-coated frying pan has an excellent ability to prevent burns after repeated cooking.

EXPERIMENT 3

Three types of frying pans, which are the same as those used in the first and second experiments, were used in the third experiment. The cooking plane of each frying pan was scrubbed with wire brushes for five minutes with the same degree of force.

As a result of the scrubbing, countless scratches were marked over the cooking plane of the uncoated steel frying pan. Countless white scratches also appeared on the cooking plane of the TEFLON-coated frying pan, and part of the TEFLON coating peeled off.

On the other hand, the TiN-coated frying pan had no scratches and maintained a lustrous shine.

Second embodiment

Figure 8:
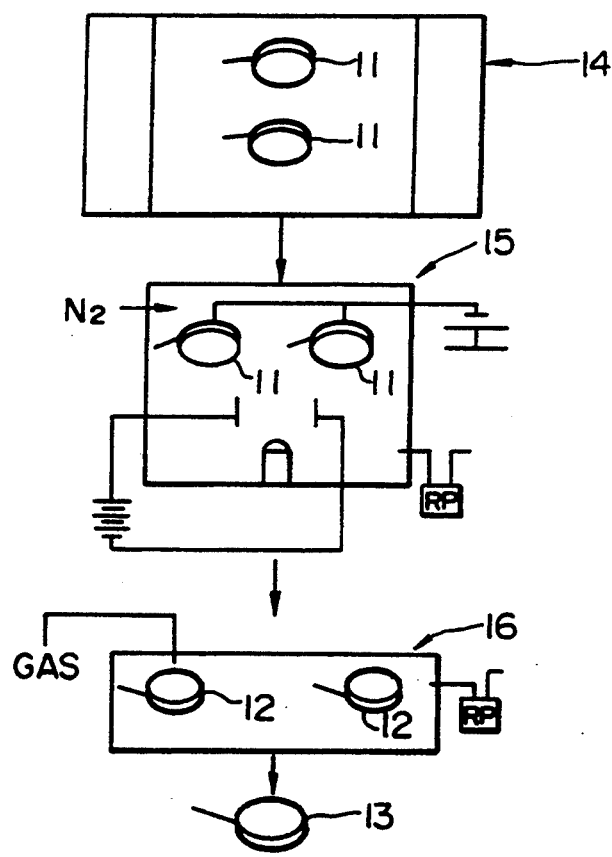
FIG. 8 is a conceptual diagram showing an example of the apparatus which implements the TiN film formation method of the present invention.

FIG. 8 is a diagram to explain the second embodiment of the present invention, in which the numeral 11 denotes a substrate of the frying pan, 12 a frying pan formed with TiN film thereon, 13 a frying pan processed for color stabilization, 14 a grinding and washing apparatus, 15 an ion plating apparatus, and 16 denotes a heat treatment apparatus which accomplishes the color tone stabilization process.

In order to form a TiN film over the surface of the substrate (11) of the frying pan using this apparatus, the surface of the frying pan substrate (11) is first ground and cleaned by the grinding and washing apparatus (14).

Figure 9:
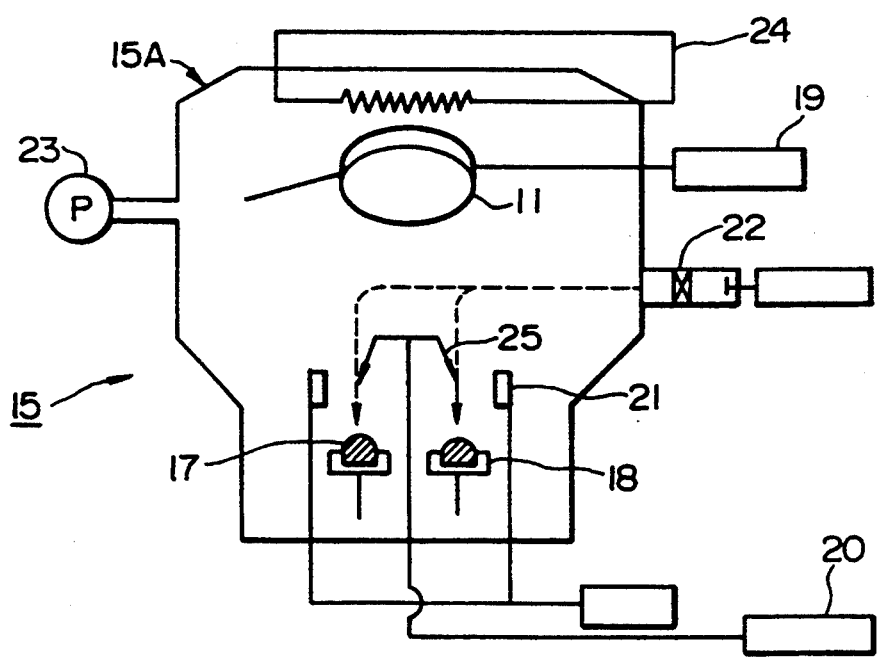
FIG. 9 is a conceptual diagram showing the ion plating apparatus used by the apparatus shown in FIG. 8.

The frying pan substrate (11) is composed of a metallic material such as steel. Because the frying pan substrate (11) may be uneven or have dust, oils, or fats attached to the surface where the film is to be formed (which could cause reduced adhesion of the TiN film to the substrate during the formation process thereof), the surface is ground, degreased and washed clean with demineralized water, acid, alkali and the like within the grinding and washing apparatus (14). The TiN film is formed on the surface of the frying pan substrate (11), which has been pretreated in such a manner, by the ion plating apparatus (15). The ion plating apparatus (15) comprising the body (15A) of the apparatus as shown in FIG. 9, a crucible (18) in which the film-formation material titanium (17) is to be placed, a power source for a substrate of an integrated circuit (19), a gas (Ar, N$_2$) supply regulator (20), an ionization electrode (21), an electron beam apparatus (22), a vacuum apparatus (23), a heater (24), and a gas (Ar, N$_2$) supply opening (25).

Several hundred volts are applied to the frying pan substrate (11), which is arranged on the side opposite to the crucible (18) containing the titanium (17), by the printed circuit substrate power source (19). The interior of the body of the ion plating apparatus (15A) is maintained at a vacuum of about $10^{-5}$ to $10^{-7}$ Torr by the vacuum apparatus (23).

Figure 10:
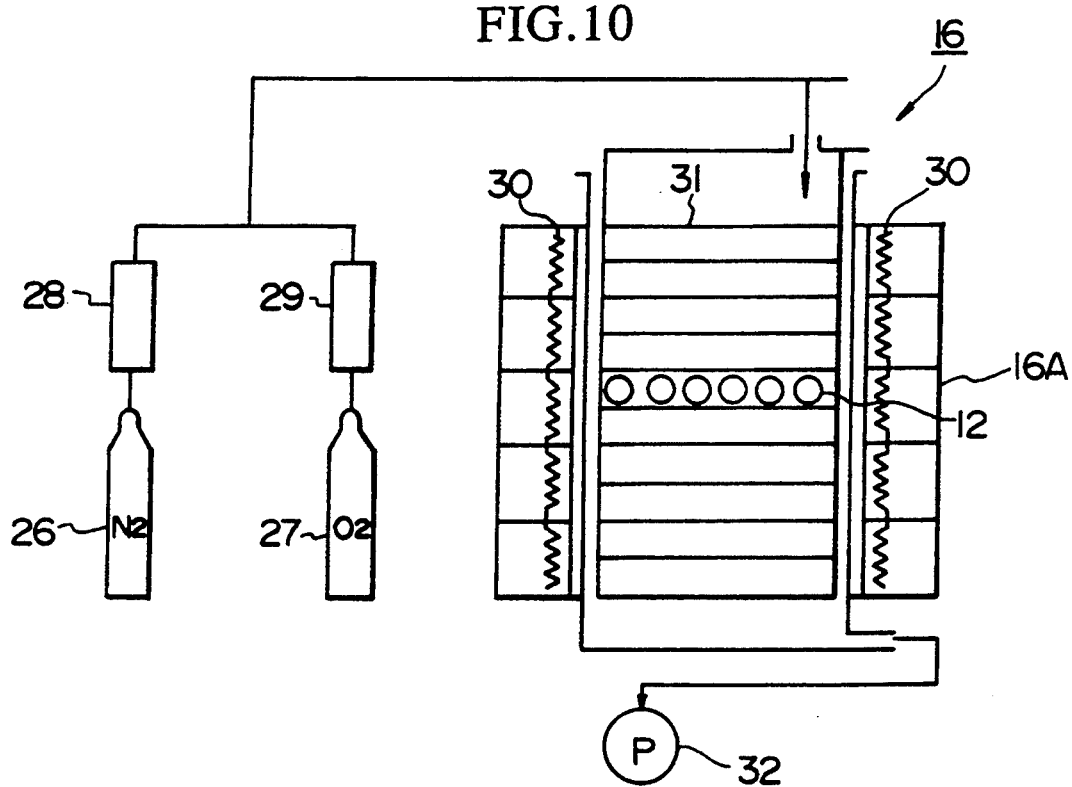
FIG. 10 is a conceptual diagram that shows an example of a heat treatment apparatus used in the apparatus shown in FIG. 8.

Under such conditions, Ar gas is injected into the apparatus by the gas supply regulator (20) to accomplish ion bombardment in the Ar atmosphere over the surface of the frying pan substrate (11). Then, the titanium (17) placed in the crucible (18) is heated and evaporated by the electron beam apparatus (22) to produce Ti particles. The Ti particles are ionized by the ionization electrode (21) to cause the ionized Ti particle to collide with the surface of the frying pan substrate (11), thereby forming the Ti film. When the thickness of the Ti film has grown to several hundred angstroms, the applied voltage of the frying pan substrate (11) is lowered, and N$_2$ is introduced from the gas supply opening (25) into the body of the ion plating apparatus (15A). The internal pressure of the ion plating apparatus (15) is then adjusted to about $10^{-5}$ Torr by the gas (Ar, N$_2$) supply regulator (20). In such a manner, the ionized Ti particles above and the N$_2$ that was also ionized are caused to react by the ionization electrode (21) and form a 2 to 3 micron TiN film over the Ti film formed on the surface of the frying pan substrate (11), thereby manufacturing a frying pan (12). The frying pan (12) is then placed in the heat treatment apparatus (16). As shown in FIG. 10, the heat treatment apparatus (16) comprising the body (16A) of the heat treatment apparatus, a nitrogen (N$_2$) cylinder (26), an oxygen (O$_2$) cylinder (27), a purifier (28, 29), a heater (30), a shelf (31), and a pump (32). A TiN-formed frying pan (12) is placed on the shelf (31) in the heat treatment apparatus body (16A) and heated. While heating, N$_2$ and O$_2$ are supplied from the N$_2$ cylinder (26) and the O$_2$ cylinder into the heat treatment apparatus body (16A) through the purifier (28, 29), so that the inside of the heat treatment apparatus body (16A) is maintained at an atmosphere of O$_2$:N$_2$=1:20 to 1:5.

Under the above conditions, the heater (30) is used to heat the TiN-formed frying pan (12) to 350° to 500° C. to form a uniform TiO$_2$ film of about several hundred angstroms over the TiN film surface, thereby obtaining a frying pan (13) with a TiN film of stabilized color tone.

Here, the temperature conditions (350° to 500° C.) used for the above operation are set to a level which is close to the upper limit where the frying pan is used at high temperatures, and yet the golden color of FiN is not lost.

In the formation method of the TiN film, the color tone of the heat-treated TiN film can be changed to various tones by changing the composition ratio of Ti:N while forming TiN film by the ion plating method. For example, if the condition of the ion plating apparatus used in this experiment is set to about Ti/N=2.0, the color tone will be light gold during the TiN film formation and turn to a gold color after the heat treatment. If the condition of the ion plating is set to about Ti/N=1.0, the color tone will be gold during the TiN film formation and turn to a deep gold after the heat treatment. It is therefore possible to obtain a frying pan with a stabilized color tone.

In a method as described above, a frying pan (13) can be obtained in which the surface of the frying pan substrate (11) is provided with a TiN film having excellent color tone stability during high-temperature cooking.

According to this method of forming TiN film, it is possible to stabilize the TiN film color tone while heating by forming a very thin TiO$_2$ film over the TiN surface, which is produced by heating Ti in the TiN film in a mixed atmosphere of oxygen and nitrogen. In addition, by properly adjusting the Ti/N ratio, which is among the conditions used for film formation with the ion plating apparatus, it becomes possible to form a TiN film of various color tones.

The frying pan obtained by the aforementioned method will have an improved appearance and will acquire a feeling of high quality because the TiN film is a beautiful gold color. Because the TiN film has a stable color tone, it will not change color when heated during cooking, and its beautiful gold color can be maintained over a long period of time.

Third Embodiment

Now, a third embodiment of the TiN film formation method according to the present invention will be described.

Figure 11:
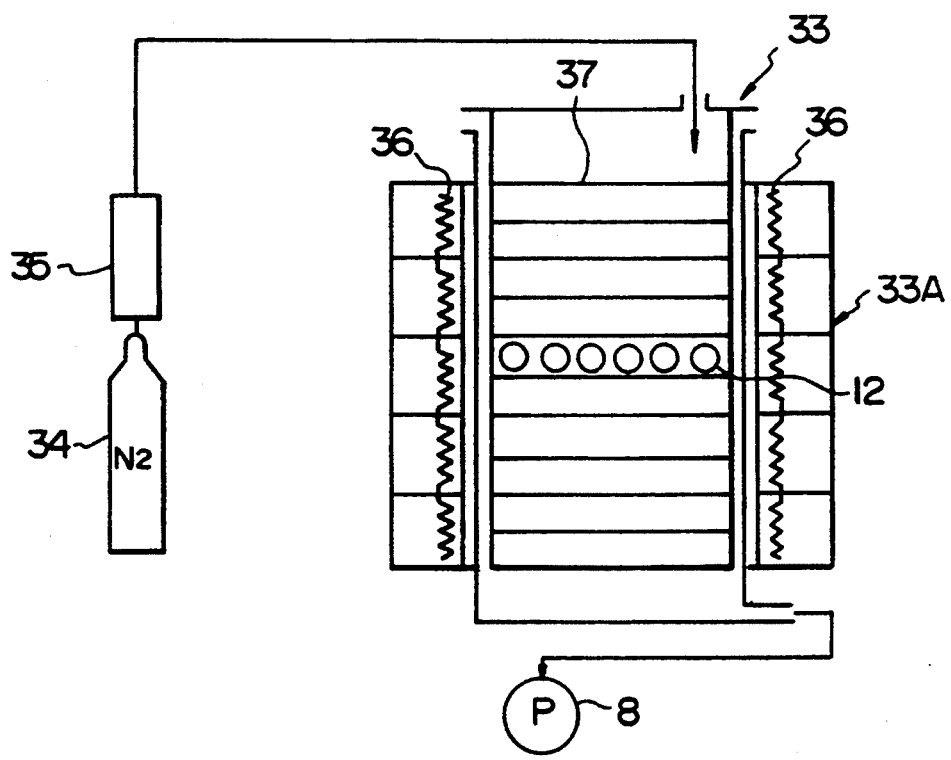
FIG. 11 is a conceptual diagram that shows another example of the heat treatment apparatus used in the apparatus shown in FIG. 8.

In this third embodiment, an apparatus similar to that used in the above embodiments is used and a frying pan (12) is obtained by forming a TiN film over the surface of the frying pan substrate (11) through operations similar to the ones above. The frying pan (12) obtained in such manner is placed in a heat treatment apparatus (33) shown in FIG. 11.

The heat treatment apparatus (33) comprising the body (33A) of the heat treatment apparatus, a nitrogen ($N_2$) cylinder (34), a purifier (35), a heater (36), a shelf (37), and a pump (38).

The frying pan (12) is placed on the shelf (37), and $N_2$ is supplied from the $N_2$ cylinder (34) into the heat treatment apparatus body (33A) through the purifier (35). The inside of the heat treatment body (33A) is maintained in an $N_2$ atmosphere (760 to 765 Torr). In such a manner, the frying pan (12) is heated to 350° to 600° C. by the heater (36) under the above conditions so as to diffuse the nitrogen into the TiN film, and the Ti remaining in the TiN during film formation becomes TiN. Most of the Ti remaining in the TiN film that can react to $N_2$ at the temperature conditions above will be turned into TiN, and a change in color tone of the TiN film will not occur because there is no longer any Ti in the TiN film that can be oxidized by the air, even if the TiN film is heated later at a temperature lower than the above (350° to 600° C.).

In the manner stated above, it is thus possible to obtain a frying pan with stabilized color tone by coating the surface of the frying pan substrate body (11) with a TiN film with excellent color tone stability at high temperatures.

With this method of TiN film formation, it is possible to heat the residual Ti in the TiN film in an individual nitrogen atmosphere to obtain TiN, thereby stabilizing the color tone of the TiN film. In addition, because most of the residual Ti in the TiN film is turned into TiN due to color tone stabilization treatment, it is possible to obtain a TiN film with excellent color tone, closer in color to pure gold than TiN film before color tone stabilization treatment.

In each of the above experiments, the TiN film is formed using the ion plating method, but other film forming methods such as the sputtering, metalization or the chemical vapor deposition method may be used to form the TiN film.

In each of the above experiments, the method for this invention is applied when manufacturing frying pans, but this invention's method can also be applied to various cooking utensils for heating other than frying pans such as a pan with a relatively shallow bottom or a spatula.

EXPERIMENT 4

The apparatus shown in FIG. 8 through FIG. 11 was used to manufacture a frying pan which has a color tone stabilized TiN film on its surface.

The frying pan substrate body (11) was placed in the grinding and washing apparatus (14), the surface thereof is ground, washed first with water then with demineralized water, acid, base, again with water and finally with alcohol.

Afterwards, this substrate (11) was then placed in the ion plating apparatus body (15A). The inside of the ion plating apparatus body (15A) was maintained in a vacuum, about $10^{-5}$ to $10^{-7}$ Torr in the vacuum apparatus (23), and several hundred volts were applied to the installed frying pan substrate (11). Then, the argon gas was injected into the apparatus which bombarded the frying pan substrate (11) with ions in an argon gas atmosphere, and a 200 Å thick layer of Ti was formed over the surface of the frying pan substrate (11). Next, the applied voltage of the frying pan substrate (11) was lowered, $N_2$ was injected into the ion plating apparatus body (15A) by the gas supply regulator (20), the internal pressure of the ion plating apparatus body (15A) is maintained at about $10^{-5}$ Torr, and a 2 to 3 micron TiN layer was formed.

The frying pan (12) obtained by the aforementioned method was placed on the shelf inside the heat treatment apparatus body (16A), $N_2$ and $O_2$ were supplied into the heat treatment apparatus body (16A) from the $N_2$ cylinder (26) and the $O_2$ cylinder (27), respectively, through the purifier (28, 29). The inside of the heat treatment apparatus body (16A) was maintained at an atmosphere of $O_2:N_2=1:20$ to 1:5 in the above manner, and the frying pan was heated to 350° C. by the heater under such conditions. As a result, a frying pan (called embodiment A) with a TiN-film surface and a gold color tone was obtained.

Similarly, the frying pan (12) was placed on the shelf (37) in the heat treatment apparatus (33), $N_2$ was supplied from the nitrogen cylinder (34) into the heat treatment apparatus body (33A) through the $N_2$ purifier (35). The inside of the heat treatment apparatus body (33A) was maintained in an $N_2$ atmosphere (760 to 765 Torr) in the manner stated above, and the frying pan was heated to 350° C. by the heater (36) under such conditions. As a result, a frying pan (called embodiment D) formed with a TiN-film surface and a pure gold color tone was obtained.

With respect to the frying pans of embodiment A and embodiment D obtained through the above operations, tests were conducted on the change in the TiN-film color tone as a result of heating, resistance to burning, and resistance to wear.

To test discoloration due to heating, the frying pan of embodiment A and a frying pan (called the compared sample) coated with TiN that was not provided with color tone stabilization treatment were heated to 300° C. As a result of heating, no discoloration was observed in the frying pan of embodiment A, but the frying pan of the compared sample changed color to yellow with a tinge of black. X-ray diffraction tests were carried out on each of the heated frying pans. The results of the X-ray diffraction tests are shown in FIG. 12.

Figure 12:
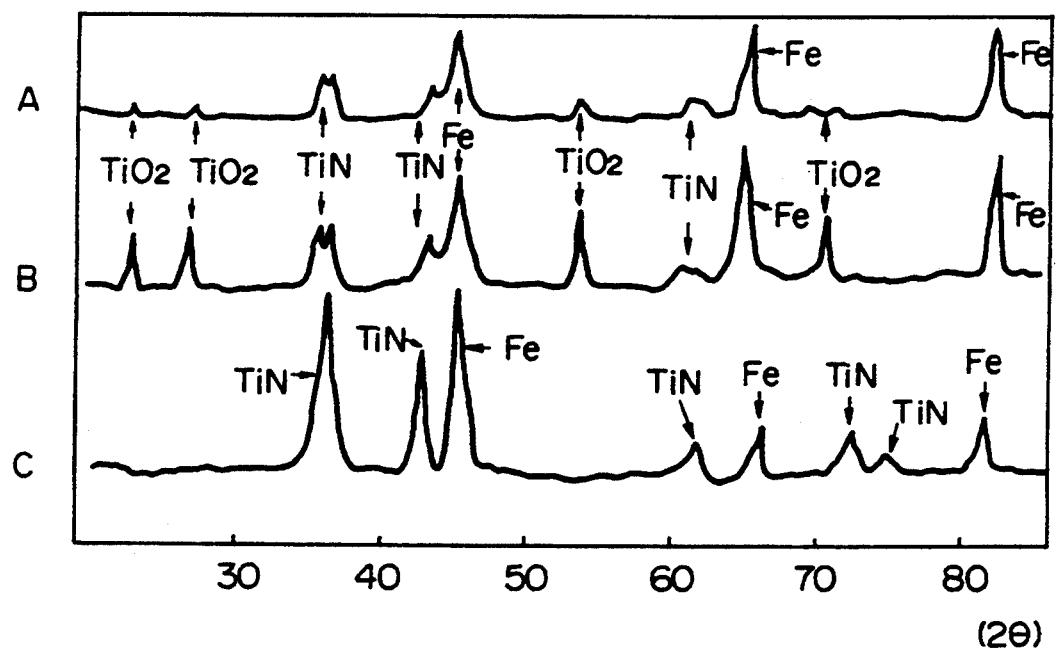
FIG. 12 is a diagram that shows the result of an X-ray diffraction in order to explain an embodiment of the present invention.

The symbol "A" shown in FIG. 12 denotes a frying pan of embodiment A provided with the TiN coating and heated to 300° C., the symbol "B" denotes a frying pan of the compared sample uncoated and heated to 300° C., and the symbol "C" denotes a frying pan of the compared sample provided with the TiN coating. A 300° C. heating test was also conducted on the frying pan of embodiment D, but no discoloration was observed.

With respect to the burning of food, the frying pans of embodiment A and embodiment D were used for long-term tests in which fish and rice cakes were baked, but both frying pans burned no food at all.

With respect to wear resistance, a wire brush was used to scrub forcibly the surfaces of the frying pans of embodiment A and embodiment D, but both frying pans showed no damage to their film surfaces and no peeled film. It was therefore confirmed that these frying pans have excellent wear resistance.

Industrial Applicability

As described above, the method of forming the TiN film and the pan according to the present invention has the following effects:

(1) The TiN film formation method according to claim 1 is a method for forming TiN film over the surface of the substrate by a physical metalization method or a chemical metalization method. The pans obtained by such methods have a TiN film with an attractive gold color formed on their surfaces, so that the cosmetic properties of the pan are improved and a look of high quality is conferred to the pan. In addition, because the TiN film has high hardness, it is possible to improve the resistance to wear of the surface of the pan. Further, because the TiN film is chemically stable and free from reactions to burning food and has excellent resistance to burning, the pan will not cause food to burn while cooking, and even if burning should occur, it can be removed easily.

(2) With the TiN film formation method according to claim 2, it is possible to obtain a TiN film with a stable color tone by heating the Ti remaining in the TiN film in a mixed atmosphere of oxygen and nitrogen to produce a transparent and stable $TiO_2$ film. The pans obtained by such a method have a TiN-film surface with an attractive gold color tone, thereby improving the cosmetic appeal thereof and producing a look of high quality. Because this pan has a transparent and stable $TiO_2$ film over the TiN film produced on the substrate surface, the beautiful gold color tone of the pan can be maintained over a long time, and the gloss of the pan will not change during heating.

(3) In the TiN film formation method according to claim 3, it is possible to obtain a TiN film with a stable color tone by heating the Ti remaining in the TiN film in an individual nitrogen atmosphere to produce TiN. The pan resulting from these methods has a TiN film with a beautiful gold color tone on its surface. As a result, it is possible to improve its decorative properties and to provide a high quality impression. Because most of the Ti remaining in the TiN film formed on the substrate surface becomes TiN, the beautiful gold color tone of the pan can be maintained over a long time, and the gloss of the pan will not change during heating.

What is claimed is:

1. A method for producing a cooking vessel comprising: forming a titanium film on the surface of a cooking vessel by physical vapor deposition or chemical vapor deposition; forming a titanium nitride film on the surface of the titanium film by physical vapor deposition or chemical vapor deposition; and then heat-treating the cooking vessel having the titanium nitride film in an atmosphere consisting essentially of oxygen and nitrogen wherein the ratio of $O_2:N_2$ is in the range between 1:20 and 1:5, and the temperature of the atmosphere is at least 350° C., thereby effecting a colortone stabilizing treatment by forming a transparent and stable titanium oxide film on the surface of the titanium nitride film.

2. A method for producing a cooking vessel according to claim 1 wherein the heat-treating is conducted at a temperature of from 350° and 500° C.

3. A cooking vessel having a titanium nitride film formed on the surface thereof which is manufactured according to claim 1.

4. A cooking vessel having a titanium nitride film formed on the surface thereof which is manufactured according to claim 2.

* * * * *

UNITED STATES PATENT AND TRADEMARK OFFICE
CERTIFICATE OF CORRECTION

PATENT NO. : 5,447,803
DATED : September 5, 1995
INVENTOR(S) : Hitoshi Hagaoka, et al.

It is certified that error appears in the above-indentified patent and that said Letters Patent is hereby corrected as shown below:

Column 1, line 11: "(TIN)" should read --(TiN)--
Column 1, line 48: "maimer" should read --manner--
Column 1, line 64: "angstoms" should read --angstroms--
Column 4, line 34: "used,," should read --used,--
Column 4, line 52: "gas-burners" should read --gas burners--
Column 6, line 38: "FiN" should read --TiN--

Signed and Sealed this

Tenth Day of September, 1996

Attest:

BRUCE LEHMAN

Attesting Officer     Commissioner of Patents and Trademarks